United States Patent [19]

Cameron, Jr. et al.

[11] Patent Number: 4,661,720
[45] Date of Patent: Apr. 28, 1987

[54] OCCUPANCY SENSOR

[75] Inventors: Maclyn C. Cameron, Jr.; Charles C. Hu, both of San Jose; Jerome M. Mix, Redwood City, all of Calif.

[73] Assignee: The Watt Watcher, Inc., Santa Clara, Calif.

[21] Appl. No.: 872,308

[22] Filed: Jun. 9, 1986

[51] Int. Cl.⁴ .............................................. G08B 13/16
[52] U.S. Cl. ..................... 307/117; 307/116; 340/572; 340/554; 340/514; 367/94; 342/175
[58] Field of Search ................ 307/116, 117; 340/551, 340/552, 553, 554, 550, 506, 514, 562, 578, 627, 507, 546, 529, 572; 367/93, 94, 96, 92, 95, 197, 198; 200/61.62, 61.64, 61.68; 310/317, 319, 324; 343/5 PD

[56] References Cited

U.S. PATENT DOCUMENTS

| | | | |
|---|---|---|---|
| 3,634,884 | 1/1972 | Ross | 343/5 PD X |
| 3,781,859 | 12/1973 | Hermans | 340/514 X |
| 4,097,853 | 6/1978 | Francis | 367/94 |
| 4,099,168 | 7/1978 | Kedjierski et al. | 307/117 X |
| 4,207,559 | 6/1980 | Meyer | 307/117 X |
| 4,307,387 | 12/1981 | Baxendale | 307/117 X |
| 4,315,596 | 2/1982 | Johnson et al. | 200/61.62 X |
| 4,319,349 | 3/1982 | Hackett | 340/554 X |
| 4,321,586 | 3/1982 | Cooper et al. | 340/572 |
| 4,361,767 | 11/1982 | Pelka et al. | 307/117 |
| 4,391,406 | 7/1983 | Fried | 200/61.62 X |

Primary Examiner—William M. Shoop, Jr.
Assistant Examiner—Shik Luen Paul Ip
Attorney, Agent, or Firm—Townsend and Townsend

[57] ABSTRACT

An improved apparatus for switching off power to an electric load in the absence of the detection of movement from the doppler shift of a transmission signal. An oscillator generates an ultrasonic transmission frequency which is transmitted via a transmission plate coupled to the oscillator. A plurality of receivers detect reflections of the ultrasonic sound signal and supply the detected signal to a bandpass filter which passes the transmission frequency. A low-pass demodulator will detect any doppler signal which modulates the transmission signal and will supply it to an amplifier for amplification. The amplified signal is then provided to a narrow band filter which will pass only a narrow band of doppler-shift signals which correspond to the frequencies of human movement. The signal is then supplied to a switching means which, when activated, will discharge a first node. The first node is charged via a resistor and a capacitor coupled to a voltage source. A comparator is coupled to the first node and is also coupled to a voltage reference. The comparator will produce an output signal when the first node has a higher voltage than the voltage reference, thereby enabling a control means which will supply current to the electric load. The detected doppler signal discharges the capacitor voltage thus insuring that an output signal is supplied while movement is detected in the room to keep the electric load supplied with current.

8 Claims, 3 Drawing Figures

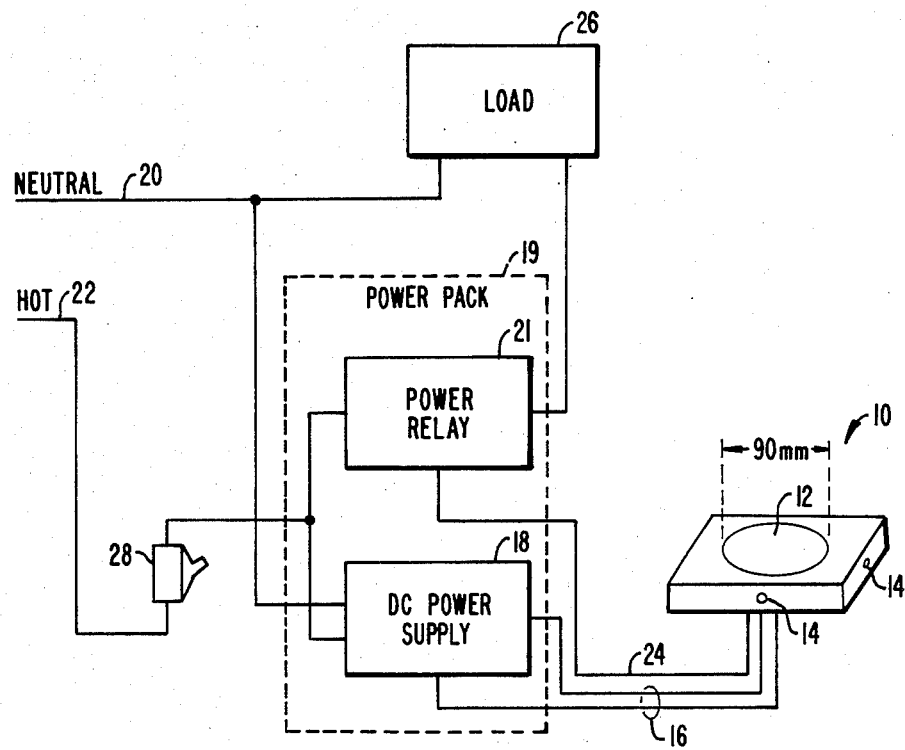
FIG._1.

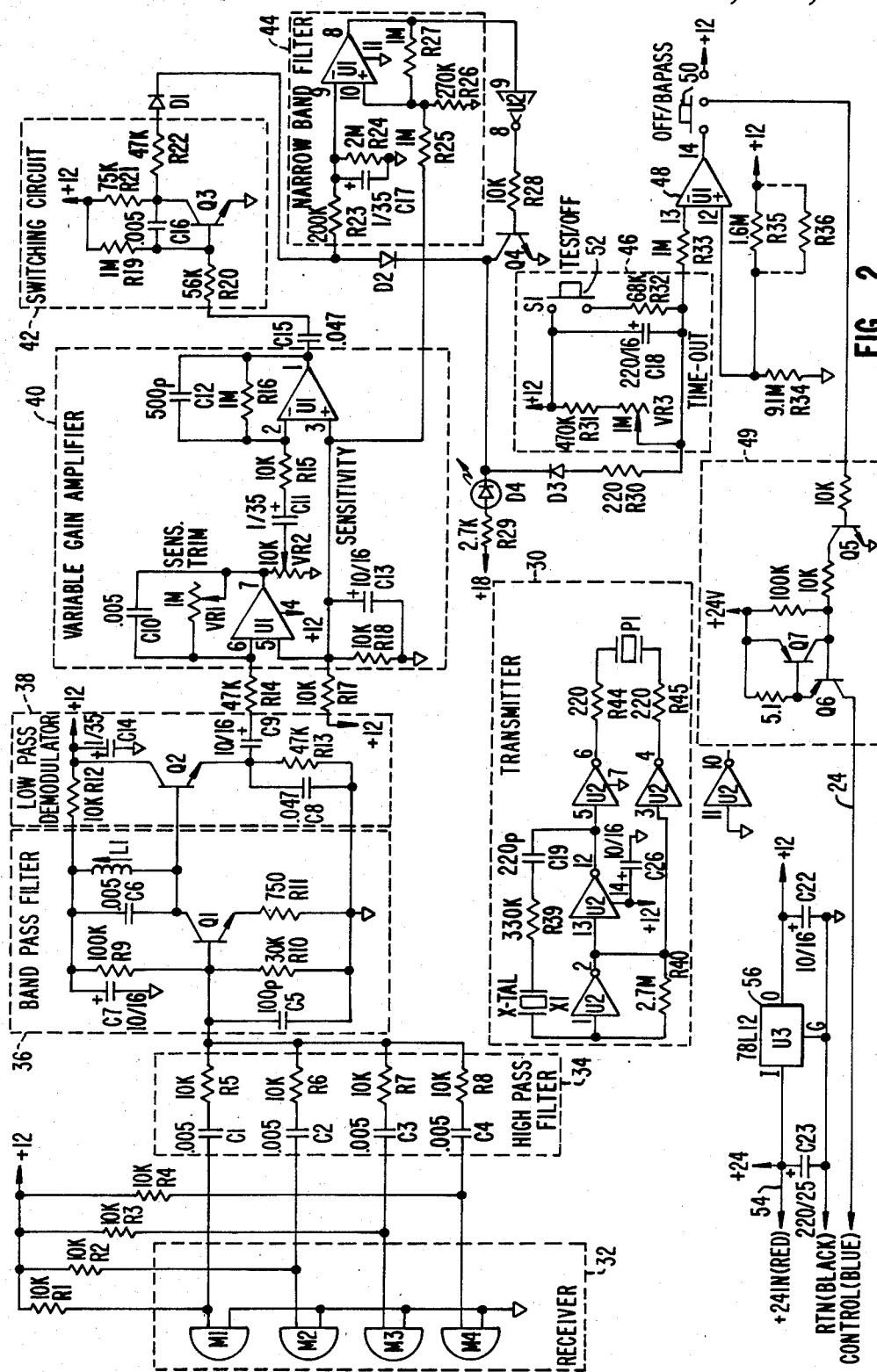
FIG._2.

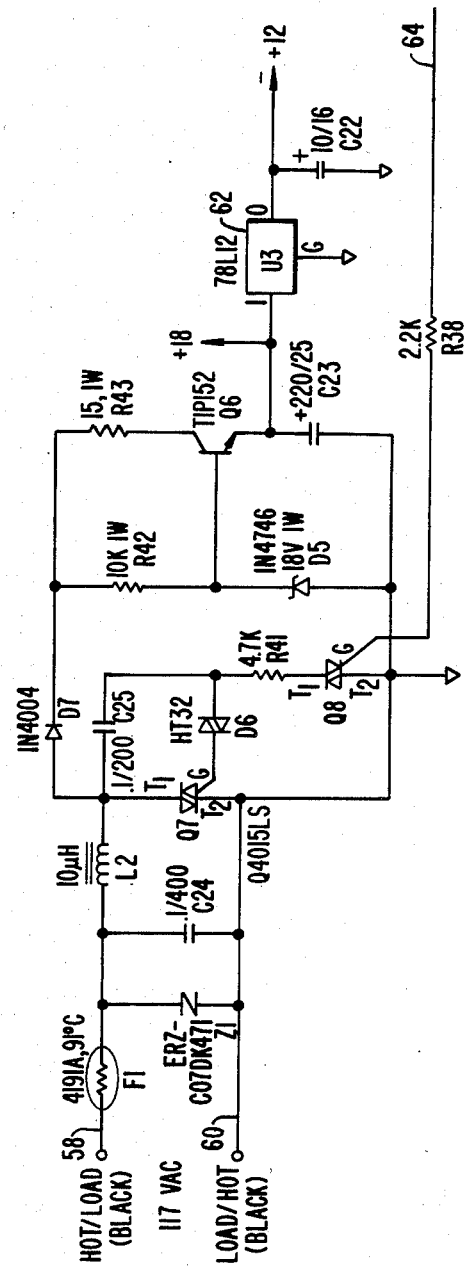
FIG._3.

OCCUPANCY SENSOR

BACKGROUND

The present invention relates to occupancy sensors for controlling lights and other electric loads by detecting doppler shifts in transmitted ultrasonic sound.

An occupancy sensor will typically transmit ultrasonic sound waves via one or more transmitters which then reflect off of objects in the room and are detected by one or more receivers. A doppler shift of the reflected signals indicates the presence of movement within the room, and can be detected by noting frequency changes from the transmitted frequency. In the absence of a detected doppler shift, an electric load can be switched off, thereby conserving energy when no people are in the room. Some examples of such systems are shown in U.S. Pat. No. 3,781,859, U.S. Pat. No. 3,383,678, U.S. Pat. No. 3,721,972, U.S. Pat. No. 4,172,253 and U.S. Pat. No. 4,021,679.

SUMMARY OF THE INVENTION

The present invention is an improved apparatus for switching off power to an electric load in the absence of the detection of movement from the doppler shift of a transmission signal. An oscillator generates an ultrasonic transmission frequency which is transmitted via a transmission plate coupled to the oscillator. A plurality of receivers detect reflections of the ultrasonic sound signal and supply the detected signal to a bandpass filter which passes the transmission frequency. A low-pass demodulator will detect any doppler signal which modulates the transmission signal and will supply it to an amplifier for amplification. The amplified signal is then provided to a narrowband filter which will pass only a narrowband of doppler-shift signals which correspond to the frequencies of human movement. The signal is then supplied to a switching means which, when activated, will charge a first node. The first node is charged via a resistor and a capacitor coupled to a voltage source. A comparator is coupled to the first node and is also coupled to a voltage reference. The comparator will produce an output signal when the first node has a higher voltage than the voltage reference, thereby enabling a control means which will supply current to the electric load. The detected doppler signal discharges the timing capacitor voltage thus insuring that an output signal is supplied while movement is detected in the room to keep the electric load supplied with current.

A potentiometer is coupled to the amplifier to vary the gain thus enabling a single unit to be adaptable to different sized rooms, rather than requiring separate units for each size of a room. A test switch is provided to change the value of the resistor in the resistor/capacitor timing circuit to vary the amount of time an absence of movement is required before the electric load will be turned off. A large circular plate is used for transmission to provide wide coverage and constant transmission quality. Four receivers are at equally spaced positions around the plate to provide uniform reception and to allow the unit to be centrally placed within a room.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram of a preferred embodiment of an occupancy sensor system according to the present invention;

FIG. 2 is a schematic diagram of a preferred embodiment of the occupancy sensor of FIG. 1; and FIG. 3 is a schematic diagram of an alternative control circuit for the circuit of FIG. 2 for operation off of line power.

DETAILED DESCRIPTION OF THE PREFERRED EMBODIMENTS

FIG. 1 shows an occupancy sensor 10 having a transmission plate 12 and a number of receivers 14. The occupancy sensor 10 receives power through a pair of lines 16 which are coupled through a DC power supply 18 in a power pack 19 to line power neutral and hot lines 20 and 22, respectively. A control line 24 from occupancy sensor 10 provides a signal to power relay 21 in power pack 19 which will couple hot line 22 to an electric load 26. The power relay can be placed in series with a standard on/off switch 28.

In operation, transmitter plate 12 is vibrated at an ultrasonic frequency and the reflected signals are detected by receivers 14. When a doppler shift is detected on the reflected signals, this indicates the presence of human movement in the room. When no doppler shift has been detected for a predetermined amount of time, a control signal on line 24 disables power relay 21, thereby removing power from load 26. When human movement is again detected, the control signal on control line 24 will enable power relay 21, thereby supplying power again to load 26.

FIG. 2 shows a preferred embodiment of a circuit implementing occupancy sensor 10 of FIG. 1. Generally, a transmitter circuit 30 transmits an ultrasonic sound which is then reflected and detected by a receiver 32. The signal from receiver 32 is passed through a highpass filter 34, bandpass filter 36 and lowpass demodulator 38 to produce the doppler-shift signal. The doppler-shift signal is then amplified in a variable gain amplifier 40 and supplied to a switching circuit 42. A narrowband filter 44 selects the portions of the doppler shift signals which correspond to a frequency of human movement. The output of narrowband filter 44 is supplied through a timeout circuit 46 to a comparator 48. Comparator 48 provides an output signal to a control line 24 which goes to the power relay 18 of FIG. 1. Comparator 48 removes the signal from control line 24 a predetermined amount of time (determined by a timeout circuit 46) after no doppler-shift signal has been detected. A current limiter circuit 49 is provided to limit the power drain on line 24.

In more detail, transmitter 30 includes a crystal oscillator X1 which supplies a 25 kHz signal to a piezoelectric device P1. The signal supplied to each side of piezoelectric device P1 is out of phase with the other signal, thus doubling the voltage applied. Piezoelectric device P1 is coupled to a transmitter plate 12 as shown in FIG. 1. Plate 12 is a circular aluminum plate with a diameter of 90 mm.

The reflected ultrasonic signals are received by receivers 32 and passed through a highpass filter 34. Bandpass filter 36 selects the 25 kHz transmission frequency. Lowpass demodulator 38 demodulates any doppler-shift signal which has modulated the 25 kHz signal and supplies the demodulated signal to variable gain amplifier 40.

A potentiometer VR1 in amplifier 40 provides a sensitivity adjustment which can be set at the factory. A second potentiometer VR2 can be user adjusted to vary the sensitivity and thus adapt the occupancy sensor to different sized rooms. The output of potentiometer VR2 goes to a second stage of the variable gain amplifier which includes a capacitor C12 and resistor R16 for further high frequency filtering and amplification of the signal.

A switching circuit 42 has a transistor Q3 which is switched on when no doppler signal is detected and is switched off when a doppler signal is detected. The output of switching circuit 42 is provided to a narrow band filter 44 having a capacitor C17 which is charged up for the frequency of interest. The frequency of interest is selected as a narrow band of doppler-shift frequencies which correspond to the expected frequencies of human movement. The doppler shift frequencies corresponding to human movement are approximately 8 Hz to 56 Hz around the transmission frequency of 25 KHz ± 0.1%. The amplifier of filter 44 is a Schmitt trigger, thus providing precise definition of the narrow band. When a doppler shift frequency of the selected narrow band is detected, transistor Q4 will switch on, providing a connection to ground to discharge timeout circuit 46. In the absence of such a connection to ground, 12 volts supplied to resistor R31, potentiometer VR3 and capacitor C18 will charge a negative input of comparator 48 up to a high voltage in an amount of time determined by the setting of potentiometer VR3. When this voltage is charged up to a value greater than the value at the positive input of comparator 48, the electric load will be switched off. Thus, transistor Q4 prevents this charge from building up as long as human activity is detected within the room. A light-emitting diode D4 indicates that the circuit has detected movement.

The output of comparator 48 is coupled through transistors Q5 and Q6 of current limiter circuit 49 to control line 24. When transistor Q6 is turned on, relay 18 of FIG. 1 will be enabled, thereby turning on the electric load. A bypass switch 50 allows the bypassing of the occupancy sensor by coupling the base of transistor Q5 to +12 volts, thus insuring that the electric load will stay on at all times. In addition, a test switch 52 is provided to couple a resistor R32 into timeout circuit 46. This resistor has a lower value than the combined value of resistor R31 and potentiometer VR3, thereby providing a much lower timeout period. Preferably, a short period of 15 seconds is provided while the normal timeout period can range from 3 to 10 minutes. Thus, the circuit can be tested without requiring the tester to wait an unduly long period of time.

The circuit of FIG. 2 is designed to operate on a 24 volt input supplied on a line 54 from power pack 19 of FIG. 1 to a regulator 56. Regulator 56 thus produces the 12 volts needed for the remaining circuitry.

FIG. 3 shows a power supply for the circuit of FIG. 2 which operates on AC line power. Power is provided across AC lines 58, 60 through an inductor L2 which passes the 60 Hertz signal to a regulator 62 which supplies the 12 volt power for the circuit of FIG. 2. A triac (or bidirectional SCR) Q7 is normally in an off position, thus preventing power from line 58 circulating back through to line 60. The electric load controlled by the occupancy sensor is in series on line 60 and is thus not turned on unless triac Q7 is activated. Triac Q7 will be activated when a signal on line 64 activates triac Q8. Line 64 is coupled to the emitter of transistor Q6 of FIG. 2 in place of line 24.

As will be understood by those familiar with the art, the present invention may be embodied in other specific forms without departing from the spirit or essential characteristics thereof. For example, a number other than four receivers could be used or the specific resistance and capacitive values shown in timeout circuit 46 could be varied. Accordingly, the disclosure of the preferred embodiment of the invention is intended to be illustrative, but not limiting, of the scope of the invention which is set forth in the following claims.

What is claimed is:

1. An apparatus for switching off power to an electric load in the absence of the detection of movement from the doppler shift of a transmission frequency, comprising:
   oscillator means for generating an ultrasonic transmission frequency;
   a transmission plate, coupled to said oscillator means, for emitting ultrasonic sound at said transmission frequency;
   a plurality of receivers for detecting reflections of said ultrasonic sound;
   a bandpass filter coupled to said receivers for passing said transmission frequency;
   a lowpass demodulator coupled to said bandpass filter for passing a doppler-shift signal;
   amplifier means, coupled to said lowpass demodulator, for amplifying said doppler-shift signal;
   narrow band filter means, coupled to said amplifier means, for passing a band of said doppler-shift signal corresponding to human movement;
   switching means, coupled to said narrow band filter means, for discharging a first node;
   a resistor and capacitor coupled to said first node and to a voltage source for charging said first node to above a first voltage level in a first, predetermined time;
   comparator means, having a first input coupled to said first node and a second input coupled to a voltage reference, for producing an output signal when said first input has a lower voltage than said second input; and
   control means, coupled to said comparator means, for supplying current to said electric load in response to said output signal.

2. The apparatus of claim 1 wherein four of said receivers are used, each of said receivers being equally spaced around said transmission plate.

3. The apparatus of claim 1 wherein said transmission plate is circular and has a diameter greater than 75 mm.

4. The apparatus of claim 1 further comprising a test switch for coupling a second resistor to said first node and said voltage source to change the time constant of said resistor and capacitor.

5. The apparatus of claim 1 further comprising a potentiometer coupled in series with said resistor to enable a user to adjust the time constant of said resistor and capacitor.

6. The apparatus of claim 1 wherein said amplifier means includes a potentiometer which is user adjustable to vary the gain of said amplifier means.

7. The apparatus of claim 1 further comprising a power supply for supplying power to said apparatus.

8. An apparatus for switching off power to an electric load in the absence of the detection of movement from the doppler shift of a transmission frequency, comprising:

oscillator means for generating an ultrasonic transmission frequency;

a circular transmission plate, greater than 75 mm in diameter, coupled to said oscillator means, for emitting ultrasonic sound at said transmission frequency;

four receivers equally spaced around said transmission plate for detecting reflections of said ultrasonic sound;

a bandpass filter coupled to said receivers for passing said transmission frequency;

a lowpass demodulator coupled to said bandpass filter for passing a doppler-shift signal;

amplifier means, coupled to said lowpass demodulator, for amplifying said doppler-shift signal, said amplifier means including a user adjustable potentiometer for varying a gain of said amplifier means;

narrow band filter means, coupled to said amplifier means, for passing a band of said doppler-shift signal corresponding to human movement;

switching means, coupled to said narrow band filter means, for discharging a first node;

a potentiometer and a capacitor coupled in parallel to said first node and to a voltage source, for charging said first node to above a first voltage level in a first, predetermined time, said time being variable by user adjustment of said potentiometer;

a test switch for coupling a second resistor in parallel with said potentiometer and capacitor, said second resistance having a smaller value than said potentiometer;

comparator means, having a first input coupled to said first node and a second input coupled to a voltage reference, for producing an output signal when said first input has a lower voltage than said second input; and control means, coupled to said comparator means, for supplying current to said electric load in response to said output signal.

* * * * *